United States Patent [19]

Pennaz

[11] Patent Number: 5,338,351
[45] Date of Patent: Aug. 16, 1994

[54] INK COMPOSITION AND METHOD OF MAKING, USING AND RECOVERING SUCH COMPOSITION

[75] Inventor: Thomas J. Pennaz, Brooklyn Park, Minn.

[73] Assignee: Deluxe Corporation, St. Paul, Minn.

[21] Appl. No.: 92,392

[22] Filed: Jul. 14, 1993

Related U.S. Application Data

[63] Continuation-in-part of Ser. No. 946,762, Sep. 17, 1992, abandoned.

[51] Int. Cl.$^5$ .................. C09D 11/08; C09D 11/10
[52] U.S. Cl. .................. 106/20 R; 106/27 R; 106/29 R; 106/30 R; 101/450.1; 101/451
[58] Field of Search .................. 106/20 R, 30 R, 27 R, 106/29 R; 101/450.1, 451; 134/27

[56] References Cited

U.S. PATENT DOCUMENTS

| | | | |
|---|---|---|---|
| 437,780 | 10/1890 | Higgins | 106/27 R |
| 1,070,713 | 8/1913 | Meckbach | 106/27 R |
| 1,822,533 | 9/1931 | Lasher | 106/31 R |
| 2,139,092 | 12/1938 | Neidich | 106/27 R |
| 2,346,968 | 4/1944 | Jeuck et al. | 106/30 R |
| 2,350,523 | 6/1944 | O'Neal | 106/27 R |
| 2,365,363 | 12/1944 | Swain | 106/27 R |
| 2,427,921 | 9/1947 | Pfaelzer | 106/27 R |
| 2,621,130 | 12/1952 | Cutler | 106/30 A |
| 2,720,461 | 10/1955 | Voet | 106/30 B |
| 3,289,577 | 12/1966 | Uhlig | 106/2 |
| 3,383,391 | 5/1968 | Carlick et al. | 106/27 R |
| 3,404,014 | 10/1968 | Drautz | 106/30 R |
| 3,434,987 | 3/1969 | Dhein et al. | 106/252 |
| 3,471,415 | 10/1969 | Friedman et al. | 524/145 |
| 3,533,811 | 10/1970 | Clements et al. | 106/24 B |
| 3,597,376 | 8/1971 | Tashiro | 106/27 R |
| 3,652,469 | 3/1972 | Glaser et al. | 106/27 R |
| 3,660,329 | 5/1972 | Wysocki | 106/30 R |
| 3,776,865 | 12/1973 | Glaser et al. | 106/27 R |
| 3,804,640 | 4/1974 | Buckwalter | 106/27 A |
| 3,844,994 | 10/1974 | Vijayendran | 106/20 R |
| 3,847,850 | 11/1974 | Rudolphy | 106/27 R |
| 3,850,648 | 11/1974 | Riedel et al. | 106/27 R |
| 3,890,156 | 6/1975 | Hiroharu et al. | 106/27 R |
| 3,900,436 | 8/1975 | Drawert et al. | 106/27 R |
| 3,914,195 | 10/1975 | Asai et al. | 106/27 R |
| 3,946,138 | 3/1976 | Jones | 106/27 R |
| 3,953,218 | 4/1976 | Pollard | 106/27 R |
| 3,981,730 | 9/1976 | Takahashi et al. | 106/27 R |
| 4,026,794 | 5/1977 | Mauceri | 210/708 |
| 4,069,179 | 1/1978 | Jones | 106/27 R |
| 4,072,644 | 2/1978 | Hedrick | 524/528 |
| 4,077,807 | 3/1978 | Kramer et al. | 106/30 R |
| 4,137,083 | 1/1979 | Hedrick | 106/20 R |
| 4,155,886 | 5/1979 | DeGoler | 106/19 R |
| 4,163,001 | 7/1979 | Carumpalos et al. | 106/20 R |
| 4,183,833 | 1/1980 | Miyaguchi et al. | 106/27 R |
| 4,221,686 | 9/1980 | Sakiyama et al. | 106/27 R |
| 4,229,747 | 10/1980 | Hwang | 106/22 R |
| 4,256,619 | 3/1981 | Miyaguchi et al. | 524/571 |
| 4,330,450 | 5/1982 | Lipowski | 524/547 |
| 4,361,843 | 11/1982 | Cooke et al. | 106/27 R |
| 4,363,886 | 12/1982 | Lipowski et al. | 523/336 |
| 4,385,149 | 5/1983 | Tsuchiya et al. | 106/20 R |
| 4,386,961 | 6/1983 | Lin | 106/27 R |
| 4,388,434 | 6/1983 | Swift et al. | 524/476 |
| 4,392,917 | 7/1983 | Lipowski et al. | 162/168.1 |
| 4,400,215 | 8/1983 | Cooke et al. | 106/27 R |
| 4,419,132 | 12/1983 | Moynihan | 106/27 R |
| 4,484,948 | 11/1984 | Merritt et al. | 106/30 R |
| 4,505,828 | 3/1985 | Lipowski et al. | 252/85.554 |

(List continued on next page.)

OTHER PUBLICATIONS

The Printing Ink Manual, Fourth Edition (1988) edited by R. H. Leach and published by VanNostrand Reinhold.

Primary Examiner—Helene Klemanski
Attorney, Agent, or Firm—Dorsey & Whitney

[57] ABSTRACT

An ink composition incorporating a water reducible resin which is water insoluble under certain conditions and selectively water washable under certain other conditions. The method aspect of the present invention relates to a method of making, using and recovering the ink composition.

38 Claims, No Drawings

U.S. PATENT DOCUMENTS

| | | | |
|---|---|---|---|
| 4,508,868 | 4/1985 | Whyzmuzis et al. | 106/27 R |
| 4,514,540 | 4/1985 | Peck | 106/20 R |
| 4,519,841 | 5/1985 | Moynihan | 106/27 R |
| 4,528,036 | 7/1985 | Rudolphy | 106/30 C |
| 4,531,976 | 7/1985 | Lin | 106/27 R |
| 4,552,592 | 11/1985 | Rudolphy et al. | 106/30 C |
| 4,552,670 | 11/1985 | Lipowski | 507/120 |
| 4,554,019 | 11/1985 | Moynihan | 106/27 R |
| 4,556,427 | 12/1985 | Lewis | 106/20 R |
| 4,579,888 | 4/1986 | Kodama et al. | 106/20 R |
| 4,589,920 | 5/1986 | Kanada et al. | 106/30 R |
| 4,595,518 | 6/1986 | Raynolds et al. | 252/8.6 |
| 4,612,051 | 9/1986 | Miller et al. | 106/30 R |
| 4,648,905 | 3/1987 | Peck et al. | 106/29 R |
| 4,659,380 | 4/1987 | Winters et al. | 106/14.14 |
| 4,664,710 | 5/1987 | Gleason et al. | 106/23 D |
| 4,664,711 | 5/1987 | Kawaguchi et al. | 106/30 R |
| 4,699,660 | 10/1987 | Frank et al. | 106/20 R |
| 4,732,616 | 3/1988 | Kondo et al. | 106/20 R |
| 4,747,882 | 5/1988 | Schwartz et al. | 106/23 R |
| 4,758,276 | 7/1988 | Lin et al. | 106/27 A |
| 4,760,104 | 7/1988 | Miyagima et al. | 106/27 R |
| 4,764,215 | 8/1988 | Rudolph | 106/27 R |
| 4,765,243 | 8/1988 | Schiefer et al. | 106/20 R |
| 4,783,220 | 11/1988 | Gamble et al. | 106/27 R |
| 4,789,399 | 12/1988 | Williams et al. | 106/20 R |
| 4,810,747 | 3/1989 | Bornack et al. | 524/538 |
| 4,822,419 | 4/1989 | Pepoy et al. | 106/20 R |
| 4,853,421 | 8/1989 | Hayes | 523/223 |
| 4,870,139 | 9/1989 | Kveglis et al. | 524/420.5 |
| 4,886,553 | 12/1989 | Gillich | 101/451 |
| 4,886,844 | 12/1989 | Hayes | 523/223 |
| 4,891,070 | 1/1990 | Dilling et al. | 106/26 R |
| 4,904,303 | 2/1990 | Rudolphy et al. | 106/30 R |
| 4,938,801 | 7/1990 | Yoshioka et al. | 106/20 R |
| 4,942,111 | 7/1990 | Wade et al. | 430/273 |
| 4,943,430 | 7/1990 | Hefford et al. | 424/70 |
| 4,944,768 | 7/1990 | Balliello et al. | 8/524 |
| 4,960,464 | 10/1990 | Chen | 106/27 R |
| 4,963,188 | 10/1990 | Parker | 106/20 R |
| 4,966,628 | 10/1990 | Amon et al. | 106/20 R |
| 4,982,661 | 1/1991 | Zweig | 101/451 |
| 4,990,185 | 2/1991 | Krishnan | 106/20 R |
| 5,004,763 | 4/1991 | Imagawa | 523/161 |
| 5,009,716 | 4/1991 | Gerson | 134/40 |
| 5,015,711 | 5/1991 | Simonet et al. | 526/301 |
| 5,017,228 | 5/1991 | Goda | 106/20 R |
| 5,021,538 | 6/1991 | Crews | 528/129 |
| 5,026,755 | 6/1991 | Kveglis et al. | 106/20 R |
| 5,030,683 | 7/1991 | Nakamura | 524/512 |
| 5,041,161 | 8/1991 | Cooke et al. | 106/27 R |
| 5,066,331 | 11/1991 | Hutter | 106/20 R |
| 5,074,915 | 12/1991 | Yoshioka et al. | 106/30 R |
| 5,077,348 | 12/1991 | Nakamura et al. | 524/512 |
| 5,084,333 | 1/1992 | Beach et al. | 428/272 |
| 5,087,659 | 2/1992 | Fujisawa | 524/594 |
| 5,098,478 | 3/1992 | Krishnan et al. | 106/20 R |
| 5,100,718 | 3/1992 | Weintraub | 428/195 |
| 5,100,934 | 3/1992 | Glesias | 106/20 R |
| 5,101,010 | 3/1992 | Dickens et al. | 106/20 R |
| 5,102,856 | 4/1992 | Doll et al. | 503/209 |
| 5,104,449 | 4/1992 | Pavlin | 106/30 R |
| 5,104,567 | 4/1992 | Staehr | 252/174.17 |
| 5,106,416 | 4/1992 | Moffatt et al. | 106/30 R |
| 5,109,054 | 4/1992 | Smith | 524/514 |
| 5,114,478 | 5/1992 | Auslander et al. | 106/30 R |
| 5,116,409 | 5/1992 | Moffatt | 106/20 R |
| 5,118,583 | 6/1992 | Kondo et al. | 101/451 |
| 5,127,948 | 7/1992 | Shepherd | 106/30 R |
| 5,324,577 | 8/1993 | Van Slyke | 134/27 |

INK COMPOSITION AND METHOD OF MAKING, USING AND RECOVERING SUCH COMPOSITION

This is a continuation-in-part of application Ser. No. 07/946,762 filed Sep. 17, 1992, now abandoned.

BACKGROUND OF THE INVENTION

1. Field of the Invention

The present invention relates generally to the field of ink compositions and more particularly to the field of lithographic compositions or oil based compositions usable in lithography in which the relationship of such composition with aqueous solutions, including its solubility, can be selectively controlled. The compositions of the present invention are unaffected by water, and thus generally water insoluble, at certain selected acidic pH levels and water washable at certain other selected alkaline pH levels. The present invention also relates to associated solutions usable with the compositions in a lithographic system and a method of making, using and recovering such compositions.

2. Summary of the Prior Art

A wide variety of printing processes currently exist in the art. Although it is contemplated that the ink composition and method of the present invention will have applicability to most if not all of these prior processes, it has particular applicability to a lithographic printing process commonly referred to as lithography. Lithography is a method of printing which relies on differences in solubility and surface wetability between an oil based component and an aqueous or aqueous based component to effectively transfer the printing ink to the desired image area and prevent it from transferring to the nonimage areas.

The printing apparatus commonly used in a lithographic process includes a printing plate which is treated to provide an oleophilic ink-accepting image area and an oleophobic ink-repelling nonimage area. Generally, the oleophilic or oil attracting image areas are hydrophobic or water repelling, and the oleophobic or oil repelling nonimage areas are hydrophilic or water attracting.

During a conventional lithographic printing process, an oil based ink composition and an aqueous fountain solution are applied to the printing plate. Because of the solubility and the wetability differences of the oil based and aqueous compositions, the fountain solution is preferentially attracted to and preferentially wets the oleophobic nonimage areas, while the ink is preferentially attracted to and preferentially wets the oleophilic image areas. It is well known and accepted in the art that successful lithographic printing requires inks which exhibit stability relative to water and thus remain water insoluble. Absence of this characteristic will result in poor print quality, poor edge definition, dot gain and various other print deficiencies. Thus, lithographic inks are selected and formulated for their ability to remain stable, cohesive and insoluble when contacted with water. The simultaneous feeding of the ink composition and fountain solution to the print plate is accomplished through a variety of methods and roller configurations known in the art.

After the ink composition and fountain solution have been applied to the printing plate and allowed to gravitate to their respective oleophilic and oleophobic areas, they are transferred either directly to an image receiving paper or other print substrate or to an intermediate blanket cylinder which then subsequently transfers the ink to the paper. The former is known in the industry as direct plate to paper lithographic printing, while the latter is generally referred to as offset lithography. In offset lithography, the blanket cylinder is covered with a transfer substrate typically made of rubber which receives the ink from the printing plate and transfers it to the print substrate.

In the typical lithographic printing system described above, the ink pigment is carried by the oil based component while the fountain solution comprises the aqueous component. Although there has been little commercial application to date, the opposite could also be used. In other words, the image areas could be oleophobic (or hydrophilic) with the ink pigment being carried by the aqueous component and the nonimage areas could be oleophilic (or hydrophobic) with the fountain solution being oil based. In either system, the lithographic process, by definition, must include both an oil based or water insoluble component and an aqueous component. Certain aspects of the present invention are applicable to either system. Thus, the present invention relates broadly to an improved oil based or water insoluble component or composition for use in a lithographic or other printing process.

During the course of lithographic printing, the printing plates are periodically changed as one job is completed and another started. Whenever this occurs, the blanket cylinder in an offset process must be cleaned to remove ink residue which is present from the previous job. Further, if a change of ink is desired, the entire print train including the application rollers, the print plate and the blanket must be cleaned. Such cleaning is commonly accomplished using an appropriately formulated wash solvent. To be effective as a wash solvent, the wash must be compatible with, or be able to dissolve or sufficiently disperse the ink. Since the inks are oil based or water insoluble, this necessitates the use of organic or petroleum based or other non-aqueous wash solvents to effectively remove the ink from the rollers, printing plates, blanket cylinder, etc.

These organic wash solvents can give rise to employee safety concerns and are a large source of both air and water pollution as volatile organic compounds (VOC's) are dispersed into the atmosphere or disposal systems. Such pollution is due to evaporation into the ambient air or into a venting system during the washing of the print components as well as the disposal or laundering of shop towels and rags used in the cleaning process. Attempts to develop water based wash or cleaning solutions have not been successful due to the inherent ability of the ink to resist water. Attempts have also been made to use water/solvent mixtures by emulsifying petroleum-based solvents into water through the use of emulsifiers and surfactants, but these products suffer from inherent instabilities due to immiscibility of water and the solvents and perform slowly. Further, such mixtures do not completely eliminate the use of petroleum solvents which are still commonly present in an amount of about 30–80%. Other industry trends include the use of solvents such as terpenes. While not petroleum based, their performance has been marginal and they are costly and in short supply. In addition, their use and disposal also pose environmental concerns.

Thus, although offset lithography is recognized and established as a dominant printing process for certain applications, drawbacks exist because of the pollution problems referred to above. These are becoming more of a drawback and more of a problem as new pollution control regulations and standards are mandated. In fact, because of the very nature of the lithographic process at least one of the components (either the ink composition or the fountain solution) must be oil based or water insoluble. This in turn necessitates the use of an organic or petroleum based solvent to wash the apparatus. This is generally accepted as a necessary limitation of the lithographic process about which little can be done.

For nonlithographic applications, certain water based or water soluble inks are currently available. Some of these utilize water dispersible or soluble resins which have been preneutralized to provide such properties. See for example U.S. Pat. No. 4,966,628 issued on Oct. 20, 1990 to Amos et al. While these inks can be cleaned up with water or water solutions and thus reduce pollution concerns, it is generally recognized that existing water soluble or dispersible inks exhibit inferior water and alkaline resistance as well as inferior drying, adhesion and gloss properties when compared to conventional oil based inks.

Accordingly, there is a need in the art to address the above problems and to substantially reduce if not eliminate these pollution concerns.

SUMMARY OF THE INVENTION

In contrast to the prior art, the present invention relates generally to an oil based or water insoluble ink composition, or to an oil based composition usable in a lithographic process, in which such compositions are substantially water insoluble and can be printed in their water insoluble form, but can be washed with an aqueous wash solution. Such compositions significantly reduce, if not eliminate, pollution and safety concerns while still maintaining highly acceptable print quality. In a nonlithographic application, the present invention relates to an oil based or substantially water insoluble ink which can be cleaned up with water. The invention also relates to a method for making such a composition, a method of using the composition in a lithographic or other printing process and a method of recovering the composition residue after it has been washed or otherwise removed from the print apparatus.

A preferred embodiment of the present invention is based upon an improved oil based or water insoluble ink composition in which the solubility or washability of the composition relative to an aqueous or aqueous based solution can be selectively controlled, while at the same time exhibiting acceptable print quality and acceptable stability during printing. More specifically, the improved ink composition of the present invention is formulated so that its solubility or washability relative to an aqueous solution can be selectively controlled by varying the pH level of such solution. This facilitates the use of an aqueous fountain solution with a first pH level during the printing process in which the ink composition is stable and insoluble and can therefore print lithographically, and the use of an aqueous wash solution with a second, generally alkaline pH level during clean up in which the ink composition is soluble or washable. Such an ink composition eliminates the need for organic or petroleum based or other non-aqueous cleaning or washing solvents which in turn minimizes or eliminates pollution and employee safety concerns while still achieving acceptable print quality.

More simply stated, the preferred ink composition of the present invention must be water insoluble during printing, but be capable of becoming selectively soluble or washable in an alkaline solution when clean-up is desired. Preferably, the composition includes a compatible, water reducible component which functions to provide the composition with the desired solubility characteristics. A further preferable feature of the system is that the change from being water insoluble to being water soluble or washable occur quickly, under ambient conditions, and utilize wash solutions which are safe and cost effective. The ink composition should also preferably employ existing ink formulation components as much as possible to minimize further reformulation, research or development. The ink composition of the present invention should also provide acceptable print quality.

Although the preferred embodiment contemplates an ink composition which is incorporated into the oil based or water insoluble component of a lithographic ink and a fountain solution which is aqueous based, these could be reversed. In such a case, the water solubility or washability of the oil based or water insoluble fountain solution would be changed when clean up is desired. It is also contemplated that the oil based ink composition of the present invention may have usefulness in print processes other than lithography, such as letter-press, gravure, flexographic, intaglio and the like, where use of an oil based or water insoluble ink which can be cleaned up with an aqueous solution is needed or desired.

The method aspect of the present invention relates to the making, using and recovery of an ink composition or oil based component of the type contemplated by the present invention or employing the general features of such composition or component. Specifically, the method of making the ink composition or component includes the steps of combining the various composition ingredients including a resin component or ingredient having selective aqueous solubility. The preferred method of making the ink composition or component involves formulating a resin component in which a portion, and in particular a solubility controlling portion, exhibits selective water solubility dependent on the pH of the solution with which it is contacted. The preferred solubility controlling portion is a water reducible resin such as a water reducible alkyd, polyester or the like.

The preferred process of using the ink composition or component includes applying the substantially water insoluble ink composition to a printing plate or other print application equipment, transferring such ink composition to a desired print receiving substrate or medium and then cleaning up or washing the application equipment with an aqueous alkaline solution. For lithographic printing, the process comprises the steps of applying the ink composition and a first aqueous solution comprising an aqueous fountain solution to a printing plate, transferring the ink composition to a receiving substrate or medium and then washing the printing plate, blanket and other print components with a second aqueous solution comprising an aqueous wash. In the preferred method, the first and second aqueous solutions have acidic and alkaline pH levels, respectively, the first in which the ink composition is insoluble and the second in which the ink composition is soluble, washable or dispersible.

Finally, the preferred method of recovering the ink composition or other oil based component residue from a printing apparatus and wash solution includes the steps of washing or removing the composition ink residue from a portion of the apparatus using an aqueous wash solution with an alkaline pH level in which the ink composition is soluble or washable. This results in formation of a mixture comprised of ink residue and wash solution as well as soiled cleaning towels containing such mixture. The pH of such mixture is then changed to a level at which the ink composition is substantially water insoluble. This results in the ink composition precipitating into a removable form. The ink residue is then removed and recovered from such mixture by filtration, centrifugation or other techniques known in the art. The above process facilitates cleaning of the soiled towels and recovery of the wash solution and ink residue. This in turn facilitates recycling or more ready disposal of the wash solution and controlled disposal of the residue.

Accordingly, it is an object of the present invention is to provide an oil based or water insoluble ink composition in which its solubility or washability relative to an aqueous medium can be controlled by selectively adjusting the pH of such aqueous medium.

Another object of the present invention to provide an improved oil based or water insoluble lithographic composition for use as, or together with, a lithographic ink composition which can be washed with an alkaline aqueous wash solution and which provides acceptable print quality.

Another object of the present invention is to provide an oil based component for a lithographic printing system in which the water solubility or washability can be selectively controlled by varying the pH of the solution which it contacts.

A still further object of the present invention is to provide a lithographic ink composition which utilizes as many existing lithographic ink ingredients as possible and which can print lithographically and be washed from the print blanket, rollers, etc. with an aqueous wash.

A further object of the present invention is to provide a method for making, using and recovering an oil based or water insoluble ink composition, and more particularly a lithographic ink composition, of the type in which the water solubility or washability can be selectively controlled.

These and other objects of the present invention will become apparent with reference to the description of the preferred composition and method and the appended claims.

DESCRIPTION OF THE PREFERRED COMPOSITION AND METHOD

The preferred embodiment of the present invention relates to oil based or water insoluble ink compositions and is described with respect to oil based or water insoluble lithographic compositions usable in a lithographic printing process. The present invention also relates to various methods involving the making, using and recovery of such compositions. As set forth above, lithography is based on the concept of providing a printing plate having oleophilic (oil attracting) and oleophobic (oil repelling) areas and providing an oil based or water insoluble component and an aqueous component to such printing plate whereby the oil based component is attracted to the oleophilic areas and the aqueous component is attracted to the oleophobic (or hydrophilic) areas. Conventional lithographic ink compositions are oil based, while the so-called fountain solutions are aqueous. This necessarily dictates use of an organic or other nonaqueous solvent when washing or cleaning the printing plates, rollers, blanket cylinder, ink train or other print components.

The preferred ink composition of the present invention is an oil based or water insoluble lithographic ink which is insoluble in water under certain conditions, but which can be selectively converted to exhibit water solubility or washability at certain other conditions. More specifically, the preferred ink composition is water soluble at certain selected pH levels while being water washable at certain selected other pH levels. As used herein, the term "washable" or "water washable" refers to a composition or component which can be removed or dispersed when exposed to certain aqueous solutions, including alkaline solutions. It should be noted that in the present application "solubility" is not necessarily equated with "washability". A composition that is soluble would certainly be washable; however, the converse is not necessarily true. To be washable, a composition must be capable of removal or dispersion, either physically or through means of solubility.

Although the preferred ink composition of the present invention is oil based or water insoluble, it is contemplated that the concept of the present invention could also apply to a lithographic system in which the ink composition is aqueous based and the fountain solution is oil based or water insoluble. In such a system, the fountain solution would be water insoluble under certain conditions or at certain pH levels and water soluble or washable at certain other conditions or pH levels. It is also contemplated that an oil based or water insoluble ink composition in accordance with the present invention will also have applicability to print processes other than lithography, including letter-press, gravure, flexographic and intaglio, among others. Additionally, the inks of the present invention will be applicable to "waterless" lithography in which special plates are used which are treated to allow one to practice lithography without the use of a fountain solution. Accordingly, unless otherwise specifically stated, the present invention contemplates applicability to both a conventional oil based or water insoluble lithographic ink composition system as well as a possible water based lithographic ink composition system and also an oil based or water insoluble ink composition useful in print processes other than lithographic.

In general, lithographic ink formulations comprise a variety of components or ingredients including a varnish or vehicle component, pigments, solvents or diluents and various additives. The pigments, solvents or diluents and additives provide the ink composition with certain desirable characteristics such as color, drying speed, tack, viscosity, etc. These may be considered optional, depending upon the particular characteristics desired. Pigments or coloring agents may include organic and inorganic pigments and dyes and other known colorants. Solvents or diluents are principally used to control viscosity, improve compatibility of other components, among others. Additives and other auxiliary components may include, for example, waxes, greases, plasticizers, stabilizers, drying agents, supplemental drying agents, thickeners, fillers, inhibitors and others known to the art.

The major component of a lithographic ink composition is commonly referred to in the industry as the lithographic ink varnish or vehicle. A lithographic ink varnish or vehicle comprises two principal components: a resin component and an oil or diluent component. As used herein, the term resin is used in its broadest sense to include all natural and synthetic resins capable of functioning as a component in a printing or printing ink environment. In the ink composition of the present invention, the varnish, and in particular the resin component, is formulated to provide the ink composition with the characteristic of being selectively water insoluble at certain pH levels and water soluble or washable at other pH levels.

Lithographic ink varnishes may be divided into two major classes depending upon the system of curing or drying the inks. The first system is an oleoresinous system which is generally used to produce quick set, heat set, and various other drying inks which set or dry by oxidation, absorption of the oil into the substrate, or solvent evaporation. The second system is known as an acrylic system which employs ultraviolet, electron beam or other radiation curing techniques. In an oleoresinous system, the vehicle is comprised of resins and oils or solvents; in radiation curable inks, these are replaced by polymerizable components such as acrylate functional oligomers and monomers known in the art. In a radiation curable system, the monomers are commonly referred to and function as diluents. The concept of the present invention is applicable to both systems; however, the preferred composition is described with respect to an oleoresinous system.

The oil or diluent component of the ink composition or varnish of the preferred embodiment may be any one of a variety of oils or oil derivatives which are commonly used in the formulation of lithographic inks. Preferably these include, but are not necessarily limited to, vegetable and other oils such as linseed, soybean or soya, castor, dehydrated castor, corn, tung, carnuba and otticita oils. Certain petroleum distillates or mineral oils can also be used in combination with or in lieu of the vegetable oils. An example of such a petroleum distillate is a solvent known as a Magie solvent which is a napthenic hydrocarbon solvent. Fatty acids can also be used. Examples of suitable fatty adds include oleic, linoleic or tall oil fatty acids. The oil or diluent component of the ink composition or varnish functions principally to dissolve and act as a carrier for the resin component. Thus, a principal requirement of the oil component is that it be compatible with, and therefore able to dissolve or be miscible with, the resin component. Various oils and oil formulations which are usable in ink compositions and in particular lithographic ink compositions are well known in the art as disclosed for example in *The Printing Ink Manual*, Fourth Edition (1988) edited by R. H. Leach and published by Van Nostrand Reinhold, the substance of which is incorporated herein by reference. Preferably the oil or diluent component of the ink varnish should comprise about 10% to 90% by weight and most preferably about 30% to 70% by weight.

The resin component in a lithographic ink composition or varnish functions, among other things, as a film former to bind the varnish and pigment together and, when the ink dries, to bind the same to the receiving substrate. The resin component also contributes to the properties of hardness, gloss, adhesion and flexibility of an ink and must be compatible with the oil or diluent component of the varnish. In conventional oleoresinous systems, the resin component is commonly comprised of a first or hard resin component and a second resin component which typically is an alkyd or polyester resin, but which can comprise various other compositions and resins as well. Preferably the ink composition of the present invention also comprises a two resin component system; however, as will be described in greater detail below, this is not a requirement.

For a two resin component system in accordance with the present invention, the first or hard resins are normally solid at room temperatures, are water insoluble regardless of the pH of the solution to which they are exposed, and typically fall into two principal classes: the modified rosin ester resins and the modified hydrocarbon resins. Various hard resins or hard resin combinations or blends can be, and have been, utilized in the ink composition of the present invention providing such resins are compatible with each other, with the oil and with the alkyd, polyester or other resin components of the varnish. As used herein, compatibility means generally soluble or miscible with one another. Hard resins usable in lithographic inks of the present invention may be comprised of natural or processed resins such as rosins, rosin esters, maleic modified resins, rosin modified fumaric resins, dimerized and polymerized rosins, asphalts such as gilsonite and the like, phenolics, rosin modified phenolics, terpenes, polyamides, cyclised rubber, acrylics, hydrocarbons and modified hydrocarbons. Also included among the available resins are those identified in *The Printing Ink Manual*, supra, the substance of which is incorporated herein by reference.

The second resin component for a two resin component ink composition or varnish of the present invention, like the hard resins, functions to form the varnish or ink composition into a cohesive material and, upon printing, bond the pigment to the receiving substrate. However, unlike the hard resins described above, this second resin component is typically not solid, but is a viscous liquids. Further, unlike resin components of conventional lithographic inks, this resin component in accordance with the present invention is formulated or selected to exhibit selective water solubility or washability behavior as a function of pH. This portion of the ink or varnish composition is hereinafter referred to as the solubility controlling portion or component of the system.

Although a two resin component system is preferred for the ink compositions of the present invention, a single resin component system incorporating the concept of the present invention can also be formulated. In the single resin component system, the entire resin component is comprised of a resin or combination of resins, all of which exhibit selective water solubility or washability as a function of pH. Thus, regardless of the type of resin system, the present invention requires at least a portion of the resin component to include a resin whose water solubility or washability behavior is pH dependent.

Alkyds and various other resins for conventional lithographic inks are normally "cooked" so as to have all or substantially all of the acid groups reacted with all or substantially all of the hydroxyl groups. This results in a product having very low hydroxyl (OH) and carboxyl (COOH) content with an Acid Number (AN) for these particular resins less than 20 and often less than 10. The Acid Number of a particular material is one accepted measure of acid functionality and is defined as the amount of potassium hydroxide (KOH) in milligrams (mg) required to neutralize one gram of the material tested. Acid Numbers of conventional lithographic ink components, and in particular those of the resin components, are minimized to reduce the ionic behavior of the composition and thereby increase the overall stability and water insolubility of the ink.

In accordance with the preferred embodiment of the present invention, it has been found that under acidic conditions, certain ink compositions can be formulated which remain sufficiently stable (i.e. sufficiently non-ionic and water insoluble) to be useful as a lithographic ink and provide highly acceptable print quality, yet which may be readily and selectively converted to a water soluble or washable form upon a shift to alkaline conditions. This allows the lithographic ink having such qualities to be printed using an acidic aqueous fountain solution and cleaned up using an alkaline aqueous wash solution.

The characteristics of a lithographic ink composition relating to water solubility or insolubility and stability are directly related to the resin component of the system which in turn are directly related to the characteristics of the solubility controlling portion of the resin component. In accordance with the present invention, the ink composition, and thus the solubility controlling portion of the resin component, should preferably be water insoluble under certain conditions and water washable at others and such water solubility behavior should be pH dependent. In the preferred embodiment, this solubility controlling portion is comprised of a water reducible resin exhibiting the desired solubility characteristics. By selecting such resin which is both compatible with the other varnish components and exhibits the desired solubility behavior to render it water insoluble at certain pH levels and water soluble or washable at certain others, it has been found that the resulting resin component, varnish and ink composition exhibit similar characteristics.

The water solubility characteristics of a water reducible, acid functional resin, and thus the water solubility characteristics of the resulting varnish and ink composition, are determined to some extent by appropriate selection of the Acid Number of such resin. More specifically, the water reducible resin and its particular Acid Number are selected so that such resin is water insoluble at certain acidic pH levels, while being water soluble or water washable at certain other alkaline pH levels.

As used herein, the term water reducible defines a property of a resin or composition which enables such resin or composition to be substantially water insoluble under certain conditions (preferably pH related) and capable of being or becoming water soluble or water washable or dispersible under certain other conditions (preferably pH related). In accordance with the preferred embodiment, the term water reducible defines a resin or composition whose water solubility behavior is pH dependent, with such resin or composition being water insoluble under acidic conditions and water washable under alkaline conditions.

The Acid Number of an acid functional resin is one measure of that particular resin to exhibit water reducible properties, (i.e.), the ability to be water insoluble at certain acidic pH levels and water soluble or washable at certain alkaline pH levels. The Acid Number at which a particular resin will exhibit water reducible behavior, however, varies from resin to resin. Some, such as certain alkyds, polyesters, polyolefins, epoxy esters, rosin derivatives and modified oils, will exhibit water reducible behavior at relatively low Acid Numbers in the range of about 25 to 200. Others, including certain modified rosins such as phenolics, maleics, fumaric and pentaerythritol esters, certain synthetic hydrocarbons as well as unmodified rosin and derivatives thereof, exhibit water reducible behavior only at relatively high Acid Numbers greater than 200, if at all. Regardless of the particular type of resin, however, the Acid Number at which such resin exhibits water reducible behavior will depend on the particular formulation of that resin.

For ink compositions in accordance with the present invention, the Acid Number of the water reducible resin must be sufficiently high to provide such resin with water reducible characteristics. Preferably this is at least about 25 and more preferably about 30. However, since the Acid Number of a resin also impacts, to some extent, the compatibility of the resin with the oil or solvent component of the varnish and its stability with respect to aqueous fountain solutions, the water reducible resin, or at least a major portion of the water reducible resin, for lithographic compositions should have an Acid Number sufficiently low to render it compatible with the oil component and to provide it with sufficient stability under acidic conditions to enable it to print lithographically. Although limited mounts of water reducible resins with high Acid Numbers (less than about 10% by weight of the varnish) can be tolerated, the major portion of the water reducible resin, for lithographic purposes, should preferably have an Acid Number less than about 200 or in the range of about 25 to 200. More preferably this Acid Number range should be less than about 150 and most preferably less than about 100. For ink compositions other than for a lithographic application, no upper limit for the Acid Number exists; however, the resin must have an Acid Number which causes it to exhibit water reducible behavior. In the case of alkyds, the Acid Number is reported for the entire molecule, including both the resin and oil portions combined.

For the solubility controlling portion of the resin component to cause the resulting varnish or ink composition to exhibit the desired water solubility characteristics or behavior, such solubility controlling portion must be present in an amount effective to result in such behavior. This will depend to some extent on the particular water reducible resins employed. In general, the lower the Acid Number at which the resin exhibits water reducible behavior, the better the clean up. For certain resins such as alkyds and oil modified resins, among others, the oil component can be and often is considered as a part of the resin molecule. In such cases, certain formulations of the water reducible resin can be present in an amount up to 100% by weight of the varnish. For other water reducible resins, and preferably the alkyds and oil modified resins as well, such solubility controlling portion, and in particular the water reducible resin, should be present in an amount of at least about 5% and more preferably between about 5-60% by weight of the varnish (the oil and resin components). Most preferably, the solubility controlling portion should be present in an amount at least about 10% or between about 10-40% by weight. For most of the water reducible resins usable in the present invention, the entire resin molecule, including the oil portion, is considered as the resin for this particular purpose. Further, for lithographic applications it is preferably that at least 5% or about 5-60% by weight of the varnish be comprised of a water reducible resin with an Acid Number less than 200, more preferably less than 150 and most preferably less than 100.

The oil portion of a particular alkyd or other resin will depend on the particular molecular structure. In general, however, the oil portion of alkyds and certain other resins will range from about 10% to 90% by weight. Alkyds are classified as long, medium or short oil alkyds depending on the quantity of oil reacted into the resin backbone. Below 50%, the alkyd is a short oil alkyd, between 50–65% the alkyds are medium oil alkyds, while above 65%, the alkyds are long oil alkyds.

It is also contemplated that in accordance with the preferred embodiment, the solubility controlling portion of the resin may comprise either a single water reducible resin or a blend of two or more such resins which exhibit the desired water solubility characteristics or behavior of being water insoluble under certain conditions or acidic pH levels and water washable under certain other conditions, preferably alkaline pH levels. It is contemplated that numerous water reducible resins currently exist or can be formulated to meet the requirements of the present invention. Many of these have been tested in lithographic or other printing environments. Specifically, it has been shown that certain water reducible alkyds (Cargill's short oil alkyds 74-7450, 74-7451; Cargill's long oil alkyd 74-7416; Cook Composite's short oil alkyd 101210), certain water reducible polyesters (Cargill's polyester 72-7203), certain water reducible polyolefins (Cargill's modified polyolefin 73-7358), certain water reducible modified oils (Cargill's modified linseed oil 73-7319) and certain water reducible epoxy esters (Cook Composite's styrenated epoxy ester 100453) exhibit the desired characteristics and are acceptable provided they are compatible with the other components of the system and are present in an amount sufficient to cause the varnish and ink composition to exhibit similar characteristics. The most preferred resins are the water reducible alkyds and water reducible polyesters. All of the above are compatible with castor oil except for Cargill's modified linseed oil 73-7319 which is compatible with linseed and soya oil and Magie solvent. Cargill's short oil alkyd 74-7451 is additionally compatible with linseed and castor oils.

For the water reducible resins and for the ink compositions or varnishes incorporating such resins as described above, water solubility or washability characteristics depend on the pH of the aqueous solution with which such compositions come into contact. Using the preferred water reducible resins of the present invention, such resins and the resulting compositions or varnishes are water insoluble at a first acidic pH level less than 7.0. Preferably the pH of the solution to which the composition will come into contact in its insoluble form is between about 3.0 and 6.5 and most preferably between about 4.0 and 5.5. The second pH level at which the water reducible resin and resulting ink composition or varnish becomes water soluble or washable is an alkaline pH having sufficient basic strength to substantially neutralize the acid groups of the water reducible resin. Preferably such pH is between about 8.5 and 14 and most preferably between about 10.5 and 13.

The ink composition or varnish of the present invention includes an excess of free acid groups by virtue of the presence of the water reducible resin with an Acid Number greater than about 25. In some ink composition formulations, certain compatible hard resins or other components can be selected which contain functional groups which can react with or tie up the free acid groups of the water reducible resin. Generally, such effect is minimal. In any event, the effective Acid Number of the solubility controlling portion, after combination with the other ink composition or varnish components, must be sufficient to result in the desired solubility behavior.

Addition of a source of hydroxy or other basic ions to the above ink composition or varnish results in the solubility controlling portion, and thus the ink composition, being converted to a water soluble or at least a water washable or dispersible form. Such source of hydroxy or other basic ions is provided in accordance with the present invention by an alkaline wash solution. The alkaline strength of such wash should be sufficient to render the solubility controlling portion, and thus the ink composition, water washable or dispersible at normal operating or ambient temperatures. Although applicant does not wish to be held to any particular explanation of this conversion, it is believed that the hydroxy or other basic ions react with or neutralize the free acid groups of the water reducible resin, thereby rendering the same water washable or dispersible. This behavior of the solubility controlling portion is then sufficient to render the entire ink composition water washable or dispersible. The present invention contemplates an ink composition which is substantially water insoluble at acidic pH conditions and is printed at those conditions. Thus, the water reducible resins used in the composition should not be preneutralized, but should exist in the ink composition in their unneutralized or substantially unneutralized form. By being unneutralized, the resins exhibit the required water reducible behavior and minimize interactions with the fountain solution during a lithographic application.

In general, the more alkaline the wash solution, the quicker and more effective the ink composition will be removed or dispersed. As set forth above, a wash solution with a pH of between about 8.5 and 14 and preferably between about 10.5 and 13 is effective to clean up blanket cylinders and rollers containing ink compositions of the present invention by use of a rag or towel dipped in the wash solution.

A wide range of alkaline cleaning agents or wash solutions can also be employed with the inks and ink compositions of the present invention. The principal property of such solutions is that they have a pH or source of hydroxy or other basic ions sufficient to convert the solubility controlling portion, and thus the ink composition to a water soluble or washable condition. The preferred wash solution contains sodium hydroxide as the hydroxy ion source; however, various other alkaline solutions can be used as well including, without limitation, solutions of the alkali metals, alkaline earth metals, ammonium, quaternary ammonium, etc. The use of surfactants, cosolvents and other additives common to the industry may also be used as a part of the wash solution. These tend to reduce the pH or the amount of wash needed to obtain acceptable wash results. Selection of the appropriate surfactant will depend on the particular composition. An example of a surfactant which may be used is a nonionic surfactant made by Mazer Chemical and sold under the tradename Mazawet 77. Certain other nonionic, cationic and anionic surfactants may be used as well.

Although the preferred embodiment has been described specifically with respect to the water solubility control of a water reducible resin, it is contemplated that multiple components of the resin system, including the entire resin component itself, may be selected to provide the desired water solubility characteristics. In accordance with the present invention, however, such portions or components must be compatible with each other and with the remainder of the system, must meet the other requirements of the lithographic or other print system including print quality requirements and must, after combination with the other composition components, exhibit aqueous solubility changes in response to changes in pH of the solution with which it is contacted.

The particular pigments, solvents, diluents and other common additives do not appreciably affect the effective free acid associated with the solubility controlling portion and thus the water solubility/insolubility behavior of the resulting ink composition.

Fountain solutions useful with the ink composition of the preferred embodiment include all commercially available acidic solutions. Preferably, such solutions should be chosen which have a working strength pH less than 6.5, and more preferably less than about 5.5. Additionally, certain fountain solution additives, such as isopropyl alcohol, alcohol substitutes, antipiling additives and the like can be used successfully with the compositions of the present invention.

In addition to the lithographic ink composition or varnish described above, the present invention relates to various methods based upon an ink composition or varnish which is water insoluble at certain conditions and water soluble or washable at certain other conditions. Specifically, the method aspects of the present invention include a method or process for making an ink composition or varnish, a method or process of printing and a method or process of recovering ink composition residue from a printing operation.

The method of making an ink composition in accordance with the present inventing comprises the steps of combining an oil diluent component and a resin component wherein such resin and oil components are compatible and wherein the resin component is selected and formulated to be substantially water insoluble at certain conditions and water soluble or washable at certain other conditions. More specifically, the above method involves a resin having a solubility controlling portion, and preferably a water reducible resin component in which the water solubility of such resin is such that it is substantially water insoluble at certain acidic pH conditions and water soluble or washable at certain other alkaline pH conditions. Most preferably the water reducible resin is a water reducible alkyd or polyester. Further, for a lithographic ink composition, such solubility controlling portion preferably includes sufficient free acid groups to provide it with an Acid Number of about 25–150 and preferably about 30–100.

The combination of the components in the preparation of a lithographic ink composition is standard in the art. Such combination generally includes charging the various varnish components (the oil and resin components) into an agitated vessel, heating the components to a temperature and for a duration sufficient to melt any hard resin components and sufficient for the oil to dissolve the resin. The combination is then normally cooled to room temperature. Various pigments, diluents and other additives may then be combined. Generally, the temperature must be above the glass transition point of the hard resins which is usually in the range of about 300° to 500° F. (189° to 260° C.). The duration of heating or "cooking" is generally about 20–30 minutes. The details of such a process are known in the art.

The method aspect of the present invention also relates to a method of printing and in particular a method of lithographic printing. Generally, such method includes applying the substantiality water insoluble ink of the present invention to a printing plate or other print application equipment, transferring such ink to a desired print receiving substrate or medium and then cleaning up or washing the printing plate or other application equipment using an aqueous alkaline wash. For lithographic printing, the method includes applying an oil based component and a water based component to a printing plate in which one of the components is an ink composition and the other is a fountain solution, transferring the ink composition to a desired medium, and then washing the oil based component with a wash solution having a pH different than that of the water based component. More specifically such method includes the steps of first applying an oil based lithographic ink composition and an aqueous fountain solution to a lithographic printing plate in which the ink composition is water insoluble at acidic pH conditions and water soluble or washable at alkaline pH conditions and in which the aqueous fountain solution has a selected acidic pH in which the oil based lithographic ink composition is generally insoluble. The printing plate has oleophilic and oleophobic areas to receive the ink composition and the aqueous fountain solution, respectively. The ink composition which is received by the oleophilic areas of the printing plate is then transferred from the printing plate to a receiving medium. This can be a sheet of paper or other substrate such as in a direct printing method or can be a blanket positioned on a cylinder such as is common in an offset method.

The final step in the method of using the lithographic ink composition is to wash or clean the printing press or other print components with an aqueous wash solution having a selected alkaline pH at which the ink composition is soluble or washable. Preferably, the fountain solution is acidic with a pH of less than 7.0, more preferably less than 6.5 and most preferably less than about 5.5 and the wash solution is alkaline with a pH greater than 7.0, preferably greater than 8.5 and most preferably greater than about 10.5.

A further aspect of the method of the present invention is a method of recovering the ink composition residue from a printing apparatus, preferably for disposal purposes. Such recovery method can be used in any printing process to recover the oil based component or the residue thereof, but has particular applicability to a lithographic process which utilizes an oil based lithographic ink composition which is water insoluble at selected first pH levels and water washable at selected second pH levels. The recovery method is applied after a lithographic process has been completed, or when an ink change or printing plate change is desired. The process includes removing the lithographic ink residue from portions of the print apparatus. Such apparatus can include one or more of the ink train, the printing plate, the rollers, the blanket cylinder or various other components which are exposed to the ink composition. The ink residue is removed using an aqueous wash solution with a pH effective to convert the ink composition, and thus the ink residue, to a water soluble or water washable form. In the preferred method, the wash solution is alkaline and has a pH greater than 7.0, preferably greater than 8.5 and most preferably greater than about 10.5. Application of the wash to the blanket is commonly accomplished with a shop towel dipped in the wash solution.

The washing step results in the formation of a mixture of ink residue and wash solution. The pH of this mixture is then modified to a pH which is generally acidic and effective to render the ink residue water insoluble. This results in the ink residue precipitating or otherwise separating from the water phase and facilitates removal of the residue through centrifugation, filtration or various other techniques known in the art. The wash from which the residue has been removed can then preferably be readjusted to the desired pH and reused as wash solution. The shop towels which contain ink residue can also be cleaned in a similar manner to remove the ink residue.

Having described the details of the preferred composition and methods, the following examples will demonstrate the applicability of the present invention to a wide range of printing equipment, plates, ink components, fountain solutions, and cleaning agents. Unless otherwise specified all percentages are "by weight". In all examples 100 grams of ink composition were prepared.

Examples 1–4 demonstrate the applicability of the present invention to various pigments and dyes presently used in lithographic ink compositions. All ink compositions were produced by cooking the varnish comprised of the hard resin, alkyd and oil at a temperature of about 200° F. (93° C.) and for a sufficient period (about 20–30 minutes) to melt the hard resin and cause the oil to dissolve the hard resin and the alkyd. The pigment was then added and milled on a laboratory scale three roll mill to adequately disperse the pigment. In these examples, the alkyd was a commercially available water reducible alkyd which was solvent stripped. The Acid Number of the alkyd was 47–53. The alkyd in Examples 1–4 is a short oil alkyd containing less than 50% by weight oil. Print tests were conducted on an A. B. Dick 375 offset duplicator fitted with a Dahlgren Chem-Series dampener. Plates were Kodak (Product Code 2984) aluminum and the fountain solution used was Rosos KSP#10 ASM2, with a working strength pH of 5.2. The paper used was Nekoosa 24# Ardor bond white. Print densities were measured using art X-Rite model 418 color densitometer.

The press was run for 300 impressions and stopped every 100 impressions, at which time the blanket was cleaned using water adjusted to pH 13 using sodium hydroxide. At the conclusion of the press test, the rollers were cleaned using water adjusted to pH 13 using sodium hydroxide. The print quality including print density, edge definition and permanency were acceptable.

EXAMPLE 1

Process Black

| | |
|---|---|
| Technical Grade Rosin (EM Science RX0170) | 33% |
| Alkyd (Cargill 074-7451) AN 47-53 | 17% |
| Castor Oil (United Catalyst USP) | 37% |
| Carbon Black (Cabot Regal 400R) | 13% |
| Print density: 1.6 | |

EXAMPLE 2

Process Cyan

| | |
|---|---|
| Technical Grade Rosin (EM Science RX0170) | 36% |
| Alkyd (Cargill 074-7451) AN 47-53 | 18% |
| Castor Oil (United Catalyst USP) | 36% |
| Blue 15:3 (Uhlich color #B1-0500) | 10% |
| Print density: 1.0 | |

EXAMPLE 3

Process Magenta

| | |
|---|---|
| Technical Grade Rosin (EM Science RX0170) | 31% |
| Alkyd (Cargill 074-7451) AN 47-53 | 17% |
| Castor oil (United Catalyst USP) | 37% |
| Red 81 (Uhlich color (RD-1143) | 15% |
| Print density: 1.2 | |

EXAMPLE 4

Process Yellow

| | |
|---|---|
| Technical Grade Rosin (EM Science RX0170) | 37% |
| Alkyd (Cargill 074-7451) AN 47-53 | 17% |
| Castor oil (United Catayst USP) | 36% |
| Yellow 12 (Uhlich color #YE-0150) | 10% |
| Print Density: .9 | |

Examples 5–9 demonstrate the applicability of the present invention to a variety of hard resins. Inks were produced using the standard procedure of first cooking the varnish and then milling in the appropriate pigment as provided in Examples 1–4. All inks set forth in these examples were process black formulas which were evaluated using the procedure set forth in Examples 1–4. The compositions of Examples 5–9 were printed using the fountain solution described in Examples 1–4 and washed up using the wash solution of Examples 1–4. The water reducible resin (the alkyd) in Examples 5–7 was the same as that in Examples 1–4. The solubility controlling portion of Examples 8 and 9 utilized a water reducible modified linseed oil with an Acid Number of 95–105. The hard resin in Example 9 was a straight hydrocarbon resin known by the trademark Nevroz. The print quality and clean up in all examples were acceptable.

EXAMPLE 5

| | |
|---|---|
| Varnish Cook | |
| Temperature: 330° F. (166° C.) | |
| Maleic ester modified rosin (Unirez 7003 - Union Camp Co.) | 29% |
| Alkyd (Cargill 074-7451) AN 47-53 | 16% |
| Castor Oil (United Catalyst USP) | 15% |
| Oleic Acid (Emersol 213 NF, Henkel Co.) | 27% |
| Carbon Black (Cabot Regal 400R) | 13% |

EXAMPLE 6

| | |
|---|---|
| Varnish Cook | |
| Temperature: 235° F. (113° C.) | |
| Pentaerythritol ester of rosin (Unitac R-100, Union Camp Co.) | 31% |
| Alkyd (Cargill 074-7451) AN 47-53 | 17% |

| Castor Oil (United Catalyst USP) | 16% |
|---|---|
| Oleic Acid (Emersol 213 NF, Henkel Inc.) | 23% |
| Carbon Black (Cabot Regal 400R) | 13% |

EXAMPLE 7

| Varnish Cook Temperature: 330° F. (166° C.) | |
|---|---|
| Fumaric acid rosin (Unirez 8200 - Union Camp Co.) | 26% |
| Alkyd (Cargill 074-7451) AN 47-53 | 14% |
| Castor Oil (United Catalyst USP) | 15% |
| Oleic Acid (Emersol 213 NF, Henkel Inc.) | 32% |
| Carbon Black (Cabot Regal 400R) | 13% |

EXAMPLE 8

| Varnish Cook Temperature: 265° F. (129° C.) | |
|---|---|
| Phenolic modified rosin ester (Uni-Rez 9266, Union Camp) | 23% |
| Modified Linseed Oil (Cargill 73-7319) AN 95-105 | 17% |
| Linseed Oil (Degen Oil OGN/04-14) | 25% |
| Oleic Acid (Emersol 213 NF, Henkel Co.) | 22% |
| Carbon Black (Cabot Regal 400R) | 13% |

EXAMPLE 9

| Varnish Cook Temperature: 320° F. (160° C.) | |
|---|---|
| Nevroz 1520 | 34% |
| Magie Solvent 60 | 17% |
| Vista Solvent 47 (Vista Chem.) | 17% |
| Modified Linseed Oil (Cargill 073-7319) AN 95-105 | 19% |
| Carbon Black (Cabot Regal 400R) | 13% |

Examples 10-13 demonstrate the applicability of the present invention with a variety of ink oils currently used in the lithographic ink industry. Inks were prepared, printed, tested and cleaned up in the same manner as those set forth in Examples 1-4. Acceptable print quality and clean up were accomplished in all cases.

EXAMPLE 10

| Varnish Cook Temperature: 200° F. (93° C.) | |
|---|---|
| Rosin (EM Science RX0170) | 36% |
| Modified Linseed Oil (Cargill 073-7319) AN 95-105 | 16% |
| Linseed Oil (Degen Oil OGN/04-14) | 18% |
| Oleic Acid (Emersol 213NF, Henkel Co.) | 17% |
| Carbon Black (Cabot Regal 400R) | 13% |

EXAMPLE 11

| Varnish Cook Temperature: 200° F. (93° C.) | |
|---|---|
| Rosin (EM Science RX0170) | 36% |
| Modified Linseed Oil (Cargill 073-7319) AN 95-105 | 16% |
| Soybean Oil (Continental Mills Con32-00) | 17% |
| Oleic Acid (Emersol 213 NF, Henkel Co.) | 18% |
| Carbon Black (Cabot Regal 400R) | 13% |

EXAMPLE 12

| Varnish Cook Temperature: 200° F. (93° C.) | |
|---|---|
| Rosin (EM Science RX0170) | 36% |
| Modified Linseed Oil (Cargill 073-7319) AN 95-105 | 16% |
| Linseed Oil (Degen oil OGN/04-14) | 17% |
| Magiesol 47 (Magie Oil Co.) | 17% |
| Carbon Black (Cabot Regal 400R) | 13% |

EXAMPLE 13

| Varnish Cook Temperature: 320° F. (160° C.) | |
|---|---|
| Nevroz 1520 (Neville Chem) | 16% |
| Rosin (EM Science RX0170) | 26% |
| Vista Sol 47 (Vista Chem) | 28% |
| Modified Linseed Oil (Cargill 073-7319) AN 95-105 | 17% |
| Carbon Black (Cabot Regal 400R) | 13% |

Example 14 demonstrates the applicability of straight polyester resins which are not oil modified as the solubility controlling portion. The polyester resin selected was a water reducible polyester resin with an Acid Number of 50-60. Ink preparation, printing, evaluation and washing was conducted using the procedure set forth in Examples 1-4. Both the print quality and clean up were acceptable.

EXAMPLE 14

| Varnish Cook Temperature: 320° F. (160° C.) | |
|---|---|
| Maleic ester modified rosin (Unirez 7003, Union Camp Co.) | 35% |
| Polyester (Cargill 072-7203) AN 50-60 | 16% |
| Castor Oil (United Catalyst USP) | 18% |
| Oleic Acid (Emersol 213 NF Henkel Co.) | 18% |
| Carbon Black (Cabot Regal 400R) | 13% |

Examples 15-19 demonstrate the use of a variety of other water reducible resins as the solubility controlling portion. In Example 15 the solubility controlling portion was a water reducible short oil alkyd with an Acid Number of 47-53; in Example 16 the solubility controlling portion was a water reducible modified polyolefin with an Acid Number of 25-30; in Example 17 the solubility controlling portion was a water reducible long oil alkyd with an Acid Number of 53-58; in Example 18 the solubility controlling portion was a water reducible styrenated epoxy ester with an Acid Number of 65; and in Example 19 the solubility controlling portion was a water reducible short oil alkyd with an Acid Number of 32.

EXAMPLE 15

| Varnish Cook Temperature: 200° F. (93° C.) | |
|---|---|
| Rosin (EM Science RX0170) | 35% |
| Short Oil Alkyd (Cargill 074-7450) AN 47-53 | 16% |
| Castor Oil (US Catalyst USP) | 18% |
| Oleic Acid (Emersol 213NF, Henkel) | 18% |
| Carbon Black (Regal 400R, Cabot) | 13% |

EXAMPLE 16

| Varnish Cook Temperature: 235° F. (113° C.) | |
|---|---|
| Pentaerythritol ester of rosin (Unitac R-100, Union Camp) | 27% |
| Modified Polyolefin (Cargill 073-7358) AN 25-30 | 20% |
| Linseed Oil | 24% |
| Oleic Acid (Emersol 213NF, Henkel) | 16% |
| Carbon Black (Regal 400R, Cabot) | 13% |

EXAMPLE 17

| Varnish Cook Temperature: 200° F. (93° C.) | |
|---|---|
| Rosin (EM Science RX0170) | 35% |
| Long Oil Alkyd (Cargill 074-7416) AN 53-58 | 23% |
| Castor Oil (US Catalyst USP) | 14% |
| Oleic Acid (Emersol 213NF, Henkel) | 15% |
| Carbon Black (Regal 400R, Cabot) | 13% |

EXAMPLE 18

| Varnish Cook Temperature: 200° F. (93° C.) | |
|---|---|
| Rosin (EM Science RX0170) | 35% |
| Styrenate Epoxy Ester (Chempol 10-0453, Cook Composites) AN 65 | 23% |
| Castor Oil (US Catalyst USP) | 14% |
| Oleic Acid (Emersol 213NF, Henkel) | 15% |
| Carbon Black (Regal 400R, Cabot) | 13% |

EXAMPLE 19

| Varnish Cook Temperature: 200° F. (93° C.) | |
|---|---|
| Rosin (EM Science RX0170) | 37% |
| Short Oil Alkyd (Chempol 10-1210, Cook Composites) AN 32 | 23% |
| Castor Oil (US Catalyst USP) | 14% |
| Oleic Acid (Emersol 213NF, Henkel) | 15% |
| Carbon Black (Regal 400R, Cabot) | 13% |

Examples 20-22 demonstrate the applicability of the present invention to a variety of press configurations.

EXAMPLE 20

The ink described in Example 1 was applied to an A.B. Dick 375 offset, sheet fed press fitted with a Dahlgren Chem-Series dampening system. A Kodak #2984 aluminum printing plate was used in conjunction with Rosos KSP#10 M2 fountain solution at a pH of 5.2. A total of 20,000 impressions were printed on Nekoosa 24# Ardor bond white paper after stopping every 500 impressions to clean the blanket using ordinary tap water adjusted to a pH of 13 using sodium hydroxide. Clean copies were obtained with acceptable print densities of 1.5 measured with an X-Rite Model 418 densitometer. At the conclusion of 20,000 impressions, the rollers were cleaned using the same solution used to clean the blanket. All clean up and print quality was acceptable.

EXAMPLE 21

An identical test as described in Example 20 was conducted with the exception that the dampening system was a conventional Dahlgren dampener. The lithographic plates employed were Printware 1440 Electrostatic masters. The fountain solution was A.B. Dick 4-1080 electrostatic fountain solution which included Kelstar HT-100 alcohol replacement additive which ran at a pH of 5.0. Excellent print characteristics were observed as well as clean up characteristics using water adjusted to a pH of 13.

EXAMPLE 22

The ink described in Example 1 was applied to a Didde Glaisser web press fitted with a conventional Dahlgren dampener. The fountain solution employed was Polychrome PR625 which included Polychrome PR637 alcohol replacement as a fountain solution additive which resulted in a pH of 4.8. The press was run at 500 feet per minute with excellent print characteristics and clean up characteristics using tap water at a pH of 13.

EXAMPLE 23

Example 23 demonstrates the applicability of the ink composition of the present invention to a printing process other than lithography. The ink of Example 1 was put on a Miehle Vertical Letterpress printing press. The type used was lead produced on an Intertype casting machine. Five hundred sheets were produced on Nekoosa 24# Ardor bond white paper. At the conclusion of printing, the type and press rollers were cleaned using tap water adjusted to a pH of 13. Print and clean up was of acceptable quality.

Examples 24-30 are set forth to demonstrate the utility of the present invention with a wide variety of standard acidic fountain solutions and fountain additions. A standard test was conducted utilizing the ink composition of Example 1 on an A.B. Dick 375 offset press. The press was run for 1,000 impressions. The results exhibited acceptable print quality in all cases. The apparatus was acceptably cleaned up using water adjusted to a pH of 13.

| Ex. | Plate | Fountain Solution | Fountain Additives | pH |
|---|---|---|---|---|
| 24 | Aluminum | ROSOSKSP #10M2 | — | 5.2 |
| 25 | Aluminum | ROSOSKSP #10M2 | Kelstar HT100 | 5.2 |
| 26 | Electrostatic | A. B. Dick 4-1080 | — | 4.9 |
| 27 | Electrostatic | A. B. Dick 4-1080 | Kelstar HT100 | 4.9 |
| 28 | Silver Master | 3M Onyx | Kelstar HT100 | 6.0 |
| 29 | Silver Master | Mitsuibisi SLM-OD | Kelstar HT100 | 6.1 |
| 30 | Silver Master | Mitsuibisi SLM-OD | Isopropyl Alcohol (10%) | 6.2 |

Examples 31-33 demonstrate the use of various alkaline wash solutions. A standard test was conducted using the ink composition of Example 1. In all tests, an A.B. Dick 375 offset press was inked and printed. At 100 impression intervals, the press was stopped and the blanket cleaned until a total of 500 sheets were printed. At that point, the press roller train was cleaned using the same solution. The print quality and the clean up were acceptable in all cases.

EXAMPLE 31

| Blanket/roller wash | |
|---|---|
| Water | 99% |
| Sodium Hydroxide to pH of 13 | <1% |

EXAMPLE 32

| Blanket/roller wash | |
|---|---|
| Water | 91% |
| Nonionic surfactant (Mazawet 77 - Mazer Chemical) | 8% |
| Sodium metasilicate to pH of 12 | <1% |

EXAMPLE 33

| Blanket/roller wash | |
|---|---|
| Water | 93% |
| Butyl Cellosolv | 2% |
| Nonionic surfactant (Mazawet 77 - Mazer Chemical) | 4% |
| Sodium metasilicate to pH of 11.7 | <1% |

Example 34 demonstrates a resin system in which no hard resin is present and in which the resin component is comprised solely of water reducible resin components, namely, a short oil alkyd and a modified linseed oil. An ink of the following composition was produced using the standard procedure set forth in Examples 1–4.

EXAMPLE 34

| Short Oil Alkyd (Cargill 74-7451) AN47-53 | 16.5% |
|---|---|
| Castor Oil (United Catalyst) | 29.5% |
| Oleic Acid (Emersol 213NF, Henkel Co.) | 5.0% |
| Modified Linseed Oil (Cargill 73-7319) | 30.0% |
| Carbon Black (Regal 400R - Cabot) | 19.0% |

Press tests were conducted on an A.B. Dick 375 offset duplicator. The fountain solution used was Rosos KSP #AS M-Z (¾ ounce), Kelstar HT-100 alcohol substitute (¾ ounce), deionized water (3 ounces). Five hundred sheets were printed with excellent print quality. The press blanket and rollers were then cleaned using water adjusted to pH 13 using sodium hydroxide.

Example 35 demonstrates a radiation curable lithographic ink composition. In this example, an A.B. Dick 375 offset press was inked up and the ink film was measured using a Gardner Ink Film Thickness Gauge. The press was fitted with a conventional Dahlgren dampening system. The ink was printed on standard chrome coat 80# paper. Once printed, the stock was passed under a UVEXS LCU 7500 laboratory UV curing system. Print densities, when measured, were evaluated using an X-Rite 418 densitometer. The press was run for 300 impressions and stopped every 100 impressions, at which time the blanket was cleaned using water adjusted to pH 13 using sodium hydroxide. At the conclusion of the press test, the rollers were cleaned using water adjusted to pH 13 using sodium hydroxide. Print quality and clean-up were acceptable.

EXAMPLE 35

| Ebecure 657 (Radcure Industries) | 45% |
|---|---|
| Modified Linseed Oil 73-7319 (Cargill, Inc.) AN95-105 | 20% |
| Monomer OTA-480 (Radcure Industries) | 15% |
| Igracure 651 (Ciba-Geigy) | 2.5% |
| Igracure 184 (Ciba-Geigy) | 2.5% |
| Regal 400R (Cabot, Inc.) | 15% |

Ink Film: 0.5 rail Print Density: 1.6

Examples 36–37 demonstrate a radiation curable ink with higher and lower levels of the water reducible resin. The procedure of Example 35 was followed. Acceptable print quality and clean up were exhibited for each of Examples 36–37.

EXAMPLE 36—LOW LEVEL

| Ebecryl 657 (Radcure Industries) | 45% |
|---|---|
| Modified Linseed Oil 73-7319 (Cargill, Inc.) | 5% |
| OTA-480 (Radcure Industries) | 15% |
| Igracure 184 (Ciba-Geigy) | 2.5% |
| Igracure 651 (Ciba-Geigy) | 2.5% |
| Carbon Black-Regal 400R (Cabot, Inc.) | 15% |

EXAMPLE 37—HIGH LEVEL

| Ebecryl 657 (Radcure Industries) | 45% |
|---|---|
| Modified Linseed Oil 73-7319 (Cargill, Inc.) | 40% |
| OTA-480 (Radcure Industries) | 15% |
| Igracure 184 (Ciba-Geigy) | 2.5% |
| Igracure 651 (Ciba-Geigy) | 2.5% |
| Carbon Black-Regal 400R (Cabot, Inc.) | 15% |

Example 38 demonstrates letterpress (nonlithographic) printing using a single resin ink composition formulated with a water reducible resin having an Acid Number of approximately 200. Specifically, the water reducible resin was a fumaric acid resin known as Unirez 8200 from Union Camp Co. The ink composition was printed on a dry offset tower of a Taiyo Model #TCH-51620-3P (Tokyo, Japan) equipped with rubber rollers and photopolymer plates. The press was operated at 200 feet per minute. The print quality was acceptable. The tower and plate were cleaned with aqueous alkaline wash solution.

EXAMPLE 38

| Varnish Cook Temperature: 200° F. (93° C.) | |
|---|---|
| Fumaric Acid Resin (Unirez 8200-Union Camp Co.) | 38.4% |
| Oleic Acid (Emersol 213 NF, Henkel Co.) | 41.6% |
| Carbon Black (Cabot Regal 400R) | 20% |

Example 39 demonstrates the use of a water reducible resin (modified oil) as the only component in the varnish of a lithographic ink. The ink was produced by milling the pigment into the alkyd. The ink was evaluated using the procedure set forth in Examples 1–4. The ink of this example was printed with a fountain solution as described in Examples 1–4 having a pH of 6.72 and washed up using the wash solution of Examples 1–4. The resin of this example was a modified linseed oil containing no additional components. Fifty sheets were printed. Although the print quality and clean up were acceptable, press performance and latitude were less than some of the other examples.

EXAMPLE 39

| Modified linseed oil (Cargill 73-7319) AN95-105 | 78% |
|---|---|
| Carbon Black (Cabot Regal 400R) | 22% |

Example 40 represents an ink composition which was made and tested in accordance with the procedure of Examples 1–4 and which was also printed commercially on a Riobi 500K press fitted with a Dahlgren integrated dampener.

EXAMPLE 40

| | |
|---|---|
| Alkyd 74-7451 (Cargill) | 18.37% |
| Castor Oil (United Catalyst) | 36.46% |
| Oleic Acid (Henkel Emersol 213) | 11.91% |
| Phenolic Modified Rosin (Unirez 9405, Union Camp) | 6.8% |
| Fumaric-modified Rosin (Unirez 8200, Union Camp) | 3.3% |
| Carbon Black (Regal 400R, Cabot Co.) | 18.9% |
| Alkali Blue (BASF 515958) | 2.1% |
| Optilith #3 (Lawter International) | 2.0% |

Example 41 represents a a magnetic ink composition printed via a rotary numbering system. The ink was evaluated by printing MICR codelines on MICR bond paper. Codelines were printed using rotary numbering machines (letterpress) at 8200 impressions per hour. Signal level was 110–120 and good print quality was obtained. The press was cleaned up acceptably using water adjusted to pH 13 using sodium hydroxide.

EXAMPLE 41

| | |
|---|---|
| Magnetic Iron Oxide (Harcros MO-8029) | 66% |
| Carbon Black (Cabot Regal 400R) | 5% |
| Alkyd Resin (Cargill 074-7451) | 7% |
| Phenolic Modified Rosin (Unirez 9405, Union Camp) | 2% |
| Fumaric Acid Modified Rosin (Unirez 8200, Union Camp) | 1% |
| Oleic Acid (Emersol 213 NF, Henkel Co.) | 7% |
| Castor Oil (United Catalyst) | 7% |
| Solsperse 17000 (ICI/ZENECA) | 4% |
| Solsperse 5000 (ICI/ZENECA) | 1% |

For all of the above examples, print quality evaluations included a print density measurement and visual examinations to evaluate the amount, if any, of background ink, the ability of the ink to hold a "reverse" open and the ability of the ink to provide sharp edge definition. The evaluation of holding a "reverse" open involved printing a solid (ink) square with a fine "v" shaped non ink configuration therein. All ink formulations in the above examples provided varying degrees of acceptable print quality for all evaluations.

In addition, for Examples 1–4, a standard Sutherland "rub" test was conducted to evaluate the permanency or adhesion of the ink to the substrate. Such tests showed acceptable print quality results. Press or "cut" tests were also conducted with respect to each of the ink formulations of Examples 1–4. These involved stacking a selected number of printed sheets, applying a pressure to such sheets for a selected period of time and then determining the amount, if any, of ink transfer. All results showed acceptable ink transfer results. Sorter evaluation was also conducted with the printed sheets of Examples 1–4. Such tests met acceptable standards for permanancy of the printed image.

The washability of the blanket using a shop towel saturated with the wash solution was evaluated by wiping the blanket with a single pass to check removal of image. The washability of the roller train was evaluated by timing removal of ink from the rollers, etc.

Although the description of the preferred composition and method have been quite specific, it is contemplated that various modifications could be made without deviating from the spirit of the present invention. Accordingly, it is intended that the scope of the present invention be dictated by the appended claims rather than by the description of the preferred composition and methods.

I claim:

1. A substantially water insoluble ink composition comprised of a resin component wherein said resin component includes a solubility controlling component comprising a water reducible resin whose water solubility is pH dependent and is present in an amount sufficient to cause said ink composition to be water insoluble at an acidic pH and water washable at an alkaline pH having sufficient basic strength to convert said water reducible resin to a water washable form.

2. The ink composition of claim 1 wherein said water reducible resin has an Acid Number of about 25 to 200.

3. The ink composition of claim 2 wherein said water reducible resin has an Acid Number of about 30 to 150.

4. The ink composition of claim 2 being a lithographic ink composition.

5. The ink composition of claim 2 including an oil or diluent component compatible with said resin component and an ink varnish comprised of said oil or diluent and resin components, wherein said ink varnish includes about 5% to 60% by weight of said water reducible resin.

6. The ink composition of claim 5 wherein said ink varnish includes about 10% to 40% by weight of said water reducible resin.

7. The ink composition of claim 1 including an oil or diluent component compatible with said resin component and an ink varnish comprised of said oil or diluent and resin components, wherein said ink varnish includes at least about 5% by weight of said water reducible resin.

8. The ink composition of claim 7 wherein said ink varnish includes about 5% to 60% by weight of said water reducible resin.

9. The ink composition of claim 8 wherein said ink varnish includes about 10% to 40% by weight of said water reducible resin.

10. The ink composition of claim 1 wherein said water reducible resin is one or more of a water reducible alkyd, a water reducible polyester, a water reducible polyolefin, a water reducible modified oil and a water reducible epoxy ester.

11. The ink composition of claim 10 wherein said water reducible resin includes at least one water reducible alkyd.

12. The ink composition of claim 1 wherein said resin component includes a first resin component which is water insoluble and a second resin component which is compatible with said first resin component and includes said water reducible resin.

13. The ink composition of claim 1 wherein said water reducible resin is substantially unneutralized.

14. The ink composition of claim 1 being an oil based ink composition and including an oil component compatible with said resin component.

15. The ink composition of claim 1 wherein said water reducible resin is an alkyd or an oil modified resin and wherein said water reducible resin is present in an amount of at least about 5% by weight.

16. An oil based composition for use in a lithographic printing system comprising a resin component and an oil component compatible with said resin component, wherein said resin component includes a water reducible resin whose water solubility is pH dependent and is present in an amount sufficient to cause said composition to be substantially water insoluble at an acidic pH and water washable at an alkaline pH having sufficient basic strength to convert said water reducible resin to a water washable form.

17. The composition of claim 16 comprising an ink varnish having said oil and resin components wherein said water reducible resin is present in an amount of at least about 5% by weight of said varnish.

18. The composition of claim 17 wherein said water reducible resin is a water reducible alkyd.

19. The composition of claim 16 wherein said water reducible resin has an Acid Number of about 25 to 200.

20. A lithographic ink varnish having a resin component comprising at least one water reducible resin with an Acid Number of about 25 to 200 and which is present in an amount sufficient to cause said varnish to be substantially water insoluble at an acidic pH and water washable at an alkaline pH having sufficient basic strength to render said water reducible resin water washable.

21. The ink varnish of claim 20 wherein said water reducible resin is present in an amount of at least about 5% by weight.

22. The ink varnish of claim 20 wherein said water reducible resin is a water reducible alkyd.

23. A method for making a substantially water insoluble ink composition comprising the steps of combining an oil or diluent component and a compatible resin component, wherein said resin component includes a solubility controlling portion comprising a water reducible resin which is substantially water insoluble at an acidic pH and water washable at an alkaline pH of sufficient basic strength to substantially neutralize the water reducible resin.

24. The method of claim 23 wherein said water reducible resin is present in an amount of at least about 5% by weight.

25. The method of claim 24 wherein said water reducible resin is a water reducible alkyd.

26. The method of claim 23 wherein said ink composition is a lithographic ink composition and said water reducible resin has an Acid Number of about 25-200.

27. A method of printing comprising the steps of:
applying a substantially water insoluble ink composition to printing equipment wherein said ink composition is substantially water insoluble at acidic conditions and water washable at alkaline conditions;
transferring said ink composition to a receiving substrate and
washing said printing equipment with an alkaline wash solution.

28. A method of lithographic printing comprising the steps of:
applying an oil based component and an aqueous component to a lithographic print apparatus including a printing plate, said printing plate having oleophilic and oleophobic areas to receive said oil based component and aqueous component, respectively, one of said oil based and aqueous components being an ink composition and the other being a fountain solution, said oil based component being substantially water insoluble at acidic pH levels and water washable at alkaline pH levels and said aqueous component having an acidic pH;
transferring said ink composition to a receiving medium; and
washing at least a portion of said print apparatus with an aqueous wash solution having an alkaline pH.

29. The method of claim 28 wherein said wash solution has a pH of at least about 8.5.

30. The method of claim 28 wherein said oil based component is said ink composition.

31. The method of claim 28 wherein said receiving medium is an offset blanket cylinder.

32. The method of claim 31 including washing said blanket cylinder with said aqueous wash solution.

33. The ink composition of claim 1 being a lithographic ink composition.

34. The method of claim 27 wherein said ink composition includes a solubility controlling component which is substantially water insoluble at acidic conditions and water washable at alkaline conditions sufficient to convert said solubility controlling component to a water washable form and said washing step includes washing said printing equipment with an alkaline wash having sufficient basic strength to convert said solubility controlling component to a water washable form.

35. The method of claim 34 wherein said solubility controlling component is a water reducible resin.

36. The method of claim 27 being a method of lithographic printing.

37. The method of claim 28 wherein said oil based composition includes a solubility controlling component which is substantially water insoluble at acidic conditions and water washable at alkaline conditions sufficient to convert said solubility controlling component to a water washable form and said washing step includes washing said printing equipment with an alkaline wash having sufficient basic strength to convert said solubility controlling component to a water washable form.

38. The method of claim 37 wherein said solubility controlling component is a water reducible resin.

* * * * *

UNITED STATES PATENT AND TRADEMARK OFFICE
CERTIFICATE OF CORRECTION

PATENT NO. : 5,338,351
DATED : August 16, 1994
INVENTOR(S) : Thomas J. Pennaz

It is certified that error appears in the above-indentified patent and that said Letters Patent is hereby corrected as shown below:

In column 21, line 65, delete "rail" and insert -- mil--.

Signed and Sealed this

Twentieth Day of December, 1994

Attest:

BRUCE LEHMAN

Attesting Officer

Commissioner of Patents and Trademarks